(12) United States Patent
Farooq et al.

(10) Patent No.: US 8,158,515 B2
(45) Date of Patent: Apr. 17, 2012

(54) METHOD OF MAKING 3D INTEGRATED CIRCUITS

(75) Inventors: Mukta G. Farooq, Hopewell Junction, NY (US); Subramanian S. Iyer, Hopewell Junction, NY (US); Steven J. Koester, Ossining, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 12/697,562

(22) Filed: Feb. 1, 2010

(65) Prior Publication Data

US 2010/0193964 A1    Aug. 5, 2010

Related U.S. Application Data

(60) Provisional application No. 61/149,529, filed on Feb. 3, 2009.

(51) Int. Cl.
*H01L 21/44* (2006.01)

(52) U.S. Cl. ........ 438/667; 438/637; 438/455; 438/459; 257/E21.585

(58) Field of Classification Search .................. 438/667, 438/637–638, 455, 459
See application file for complete search history.

(56) References Cited

U.S. PATENT DOCUMENTS

| | | | |
|---|---|---|---|
| 5,851,894 A * | 12/1998 | Ramm | 438/311 |
| 5,915,167 A | 6/1999 | Leedy | |
| 6,133,640 A | 10/2000 | Leedy | |
| 6,208,545 B1 | 3/2001 | Leedy | |
| 6,551,857 B2 | 4/2003 | Leedy | |
| 6,563,224 B2 | 5/2003 | Leedy | |
| 6,627,518 B1 | 9/2003 | Inoue et al. | |
| 6,632,706 B1 | 10/2003 | Leedy | |
| 6,821,826 B1 | 11/2004 | Chan et al. | |
| 6,953,990 B2 * | 10/2005 | Gallup et al. | 257/678 |
| 7,056,813 B2 | 6/2006 | Morrow et al. | |
| 7,138,295 B2 | 11/2006 | Leedy | |
| 7,193,239 B2 | 3/2007 | Leedy | |
| 7,338,896 B2 | 3/2008 | Vanhaelemeersch et al. | |
| 7,354,798 B2 | 4/2008 | Pogge et al. | |
| 7,381,629 B2 | 6/2008 | Sankarapillai et al. | |
| 7,474,004 B2 | 1/2009 | Leedy | |
| 7,504,732 B2 | 3/2009 | Leedy | |
| 7,705,466 B2 | 4/2010 | Leedy | |
| 2002/0132465 A1 | 9/2002 | Leedy | |

(Continued)

FOREIGN PATENT DOCUMENTS

CN             1525485          4/1998

(Continued)

OTHER PUBLICATIONS

Koyanagi, et al., "Three-Dimensional Integration Technology Based on Wafer Bonding With Vertical Buried Interconnections", IEEE Transactions on Electron Devices, 53, No. 11 (Nov. 2006), pp. 2799-2808.

(Continued)

*Primary Examiner* — Thanh Nguyen
(74) *Attorney, Agent, or Firm* — Wenjie Li

(57) ABSTRACT

A method and structure of connecting at least two integrated circuits in a 3D arrangement by a through silicon via which simultaneously connects a connection pad in a first integrated circuit and a connection pad in a second integrated circuit.

14 Claims, 9 Drawing Sheets

U.S. PATENT DOCUMENTS

| | | |
|---|---|---|
| 2003/0173608 A1 | 9/2003 | Leedy |
| 2005/0067620 A1 | 3/2005 | Chan et al. |
| 2007/0037379 A1 | 2/2007 | Enquist et al. |
| 2007/0145367 A1 | 6/2007 | Chen et al. |
| 2008/0142990 A1 | 6/2008 | Yu et al. |
| 2008/0153187 A1 | 6/2008 | Luo et al. |
| 2009/0067210 A1 | 3/2009 | Leedy |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2010/0200992 A1* | 8/2010 | Purushothaman et al. ... 257/758 |
| 2010/0330743 A1* | 12/2010 | Yu et al. ............ 438/108 |

FOREIGN PATENT DOCUMENTS

| | | |
|---|---|---|
| CN | 101188235 | 4/1998 |
| CN | 98803836 | 6/2004 |
| EP | 0975472 | 4/1998 |
| EP | 1986233 | 4/1998 |
| JP | 10-543031 | 4/1998 |
| JP | 2008028407 | 8/2007 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

OTHER PUBLICATIONS

Burns, James A., et al. "A Wafer-Scale 3-D Circuit Integration Technology", IEEE Transactions on Electron Devices, 53, No. 10 (Oct. 2006), pp. 2507-2516.

* cited by examiner

METHOD OF MAKING 3D INTEGRATED CIRCUITS

This non-provisional application claims the benefit of the provisional application filed with the United States Patent and Trademark Office as Ser. No. 61/149,529 entitled "A Method Of Making 3D Integrated Circuits And Structure Formed Thereby" filed Feb. 3, 2009.

BACKGROUND OF THE INVENTION

The present invention relates generally to three dimensional (3D) integrated circuits, and more particularly to 3D integrated circuits with through silicon vias.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit resistance-capacitance (RC) delay and power consumption increase.

Three-dimensional integrated circuits are therefore created to resolve the above-discussed limitations. In a typical formation process of 3D integrated circuits, two wafers, each including an integrated circuit, are formed. The wafers are then bonded with the devices aligned. Deep vias are then formed to interconnect devices on the first and second wafers.

Much higher device density has been achieved using 3D integrated circuit technology. As a result, the total wire length is significantly reduced. The number of vias is also reduced. Accordingly, 3D integrated circuit technology has the potential of being the mainstream technology of the next generation.

Various 3D integrated circuits have been proposed by Chan et al. U.S. Application Publication 2005/0067620, Enquist et al. U.S. Patent Application Publication 2007/0037379, Chen et al. U.S. Patent Application Publication 2007/0145367, Yu et al. U.S. Patent Application Publication 2008/0142990, Luo et al. U.S. Patent Application Publication 2008/0153187, Inoue et al. U.S. Pat. No. 6,627,518, Chan et al. U.S. Pat. No. 6,821,826, Morrow et al. U.S. Pat. No. 7,056,813, Vanhaelemeersch et al. U.S. Pat. No. 7,338,896, Pogge et al. U.S. Pat. No. 7,354,798, Sankarapillai et al. U.S. Pat. No. 7,381,629, Koyanagi et al., "Three-Dimensional Integration Technology Based on Wafer Bonding With Vertical Buried Interconnections", IEEE Transactions on Electron Devices, 53, No. 11 (November 2006), pp 2799-2808, and Burns et al., "A Wafer-Scale 3-D Circuit Integration Technology", IEEE Transactions on Electron Devices, 53, No. 10 (October 2006), pp 2507-2516, the disclosures of which are incorporated by reference herein.

Of the foregoing references, Morrow et al. discloses forming backside through via connections. Chan et al. U.S. Patent Application Publication 2005/0067620 and U.S. Pat. No. 6,821,826 disclose the necessity of forming two vias to connect the wiring on joined integrated circuits. Endquist et al. U.S. Patent Application Publication 2007/0037379 and the Burns et al. paper disclose the formation of through vias that connect two levels of metal wherein the vias are formed through the silicon after the wafers are bonded.

BRIEF SUMMARY OF THE INVENTION

The various advantages and purposes of the present invention as described above and hereafter are achieved by providing, according to a first aspect of the invention, a method of making 3D integrated circuits, comprising the steps of:

forming at least one trench in a first semiconductor wafer;

filling the at least one trench with an insulator to form a filled trench;

forming devices and back end of the line (BEOL) wiring on a first side of the first semiconductor wafer with at least one pad in the BEOL wiring aligned with the at least one filled trench;

joining the first semiconductor wafer to a second semiconductor wafer having at least one landing pad aligned with the at least one filled trench in the first semiconductor wafer;

etching the at least one filled trench to remove the insulator;

forming an insulative spacer on the walls of the at least one trench;

continuing etching the at least one trench until the at least one pad and the at least one landing pad are exposed; and filling the at least one trench with an electrical conductor.

According to a second aspect of the invention, there is provided a method of making 3D integrated circuits, comprising the steps of:

forming at least one trench in a first semiconductor wafer, the at least one trench extending from a first side of the first semiconductor wafer;

filling the at least one trench with an insulator;

forming devices and back end of the line (BEOL) wiring on the first side of the first semiconductor wafer with at least one pad in the BEOL wiring aligned with the at least one trench, the BEOL wiring having an exposed surface;

obtaining a second semiconductor wafer having BEOL wiring, the BEOL wiring having at least one landing pad and an exposed surface;

joining the exposed surface of the BEOL wiring of the first semiconductor wafer to the exposed surface of the BEOL wiring of the second semiconductor wafer such that the at least one landing pad is aligned with the at least one trench;

etching the first semiconductor wafer from a second side so as to join with the and continuing etching of the at least one trench to remove the insulator and stopping in the BEOL wiring;

forming an oxide spacer on the walls of the at least one trench;

continuing etching the at least one trench until the at least one pad and the at least one landing pad are exposed; and filling the at least one trench with an electrical conductor.

According to a third aspect of the invention, there is provided a 3D integrated circuit comprising:

a first integrated circuit having a connection pad mechanically and electrically joined to a second integrated circuit having a connection pad and a single metal-filled via making simultaneous connection with the first integrated circuit connection pad and the second integrated circuit connection pad wherein the single via has a center portion, two ends and a width which is narrower in the center portion than at the two ends.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIG. 12 is a cross sectional view illustrating the final structure achieved according to the present invention.

DETAILED DESCRIPTION OF THE INVENTION

When semiconductor chips or integrated circuits (hereafter referred to as just "integrated circuits") are joined to form a 3D structure, it is necessary to form vias through the semiconductor wafer to make the various connections between integrated circuits. These through silicon vias may be made on each integrated circuit before the integrated circuits are joined in a so-called through-silicon-first process. Alternatively, these through silicon vias may be made after the integrated circuits are joined in a so-called through-silicon-last process. The through-silicon-last process has an advantage of better connectivity over through-silicon-first but the through-silicon-last process also increases the difficulty in aligning through silicon vias to top and bottom semiconductor wafers simultaneously. The present invention relates to an improved process and structure for forming through silicon vias in a through-silicon-last process.

Figure 1:
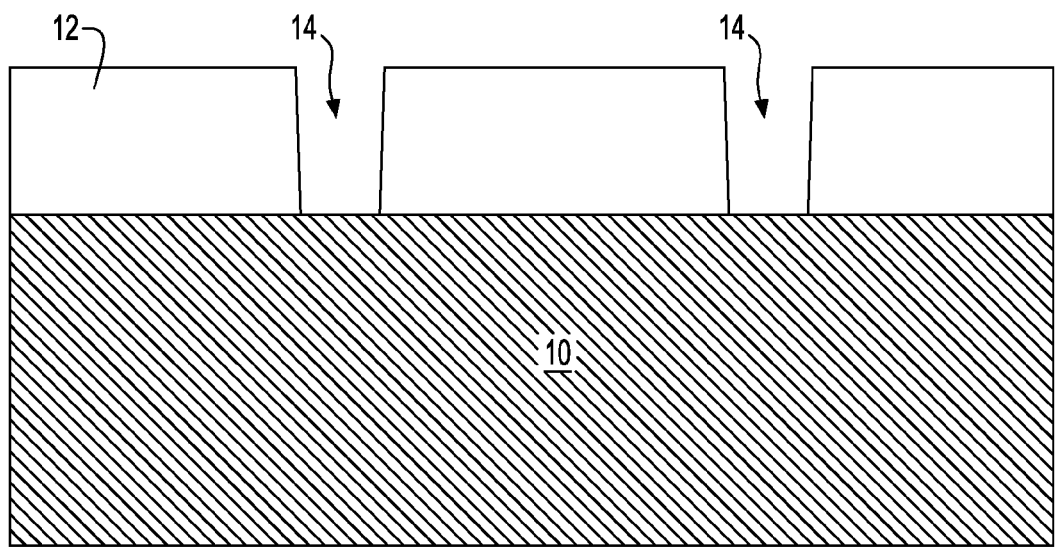
FIGS. 1 to 12 are cross sectional views illustrating the various process steps in forming a 3D integrated circuit according to the present invention.

Referring now to the drawings in more detail, and particularly referring to FIG. 1, there is illustrated a first semiconductor wafer 10 having a hardmask 12 having patterned openings 14 for forming the trenches for the through silicon vias. The semiconductor material useful for the present invention is any semiconductor material including but not limited to group IV semiconductors such as silicon, silicon germanium, or germanium, a III-V compound semiconductor, or a II-VI compound semiconductor.

Figure 2:
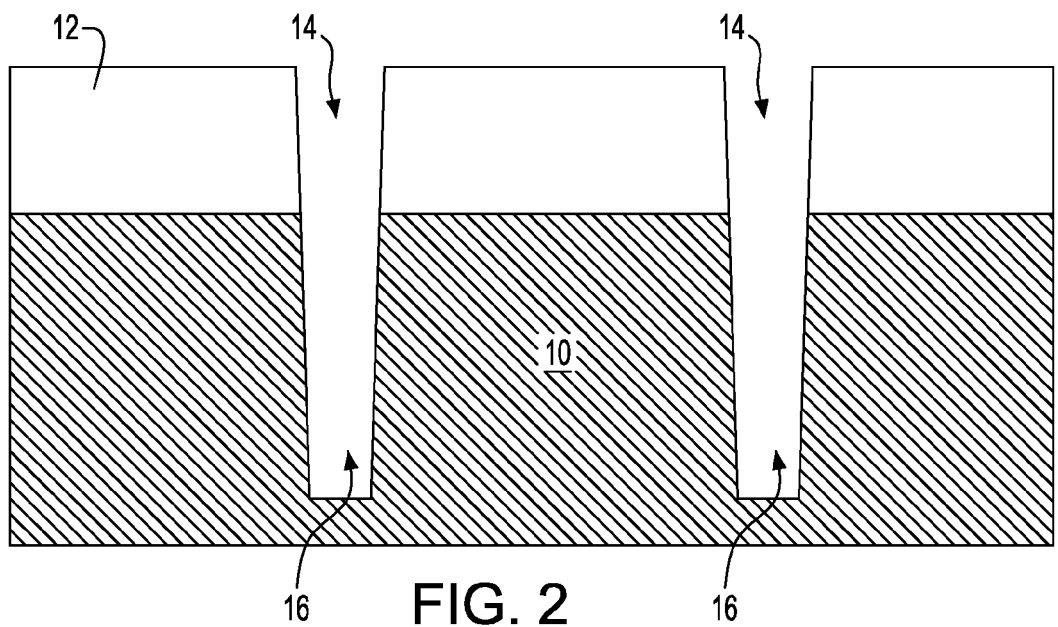

Referring now to FIG. 2, the pattern openings 14 in the hardmask 12 have been driven into the first semiconductor wafer 10 by a conventional reactive ion etching (RIE) process to form trenches 16 in the first semiconductor wafer 10. It is noted that the trenches 16 do not extend entirely through the first semiconductor wafer 10 due to the difficulty of reactive ion etching through the entire thickness of the first semiconductor wafer 10.

Figure 3:
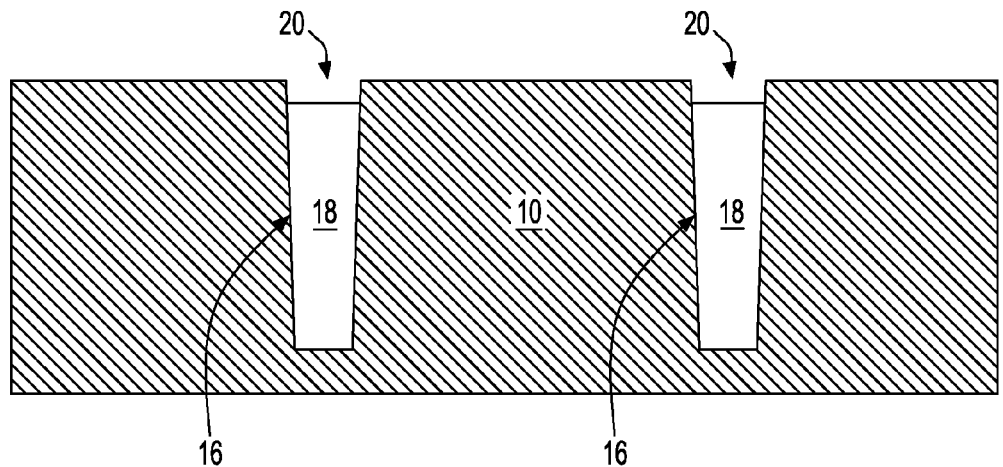

Referring now to FIG. 3, the trenches 16 are filled with an insulative material 18 such as an oxide. The hardmask 12 is then stripped. Alternatively, it should be understood that the hardmask 12 may be stripped prior to filling the trenches 16 with insulative material 18. It is desirable to then recess or etch back by RIE or wet etch the insulative material 18 as indicated by reference number 20. Etching back is an optional process step which may be desirable to remove any surface damage and any level variation.

Figure 4:
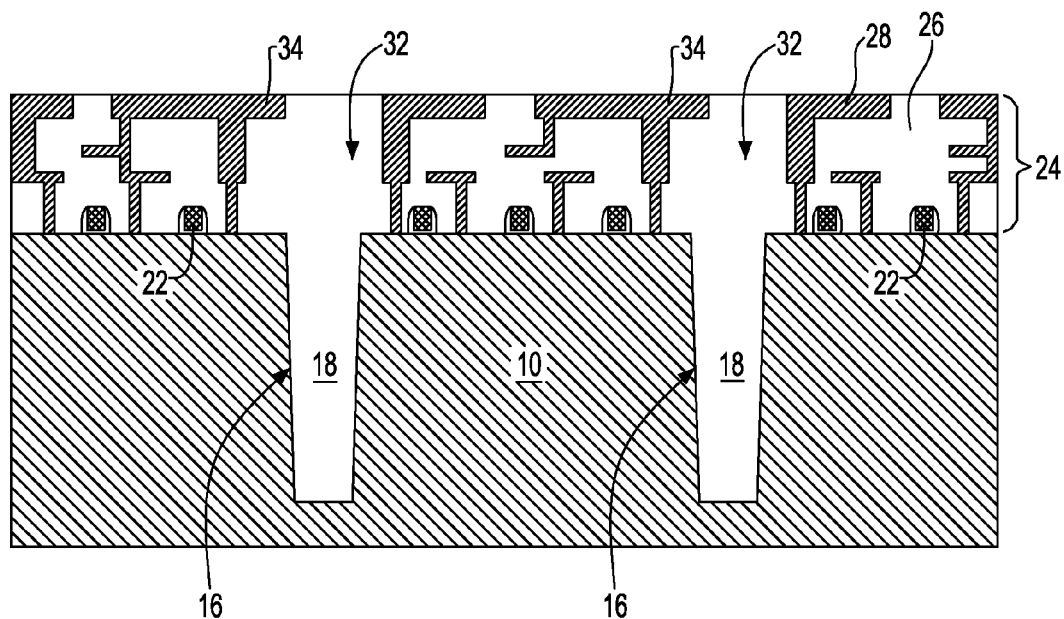

Devices 22 and back end of the line (BEOL) wiring 24 are then added according to conventional practice as shown in FIG. 4. The BEOL wiring 24 typically includes an insulative material 26, such as an oxide, and various wiring layers 28 which are well known to those skilled in the art. The BEOL wiring 24 has been aligned with respect to the filled trenches 18. By aligned, it is meant that there are gaps 32 in the BEOL wiring 24 which will allow the passage of a through via to join with a second semiconductor wafer to be discussed hereafter. In addition, the BEOL wiring 24 has certain pads 34 which protrude into the gap 32 for connection to the through via to be discussed hereafter.

Figure 5:
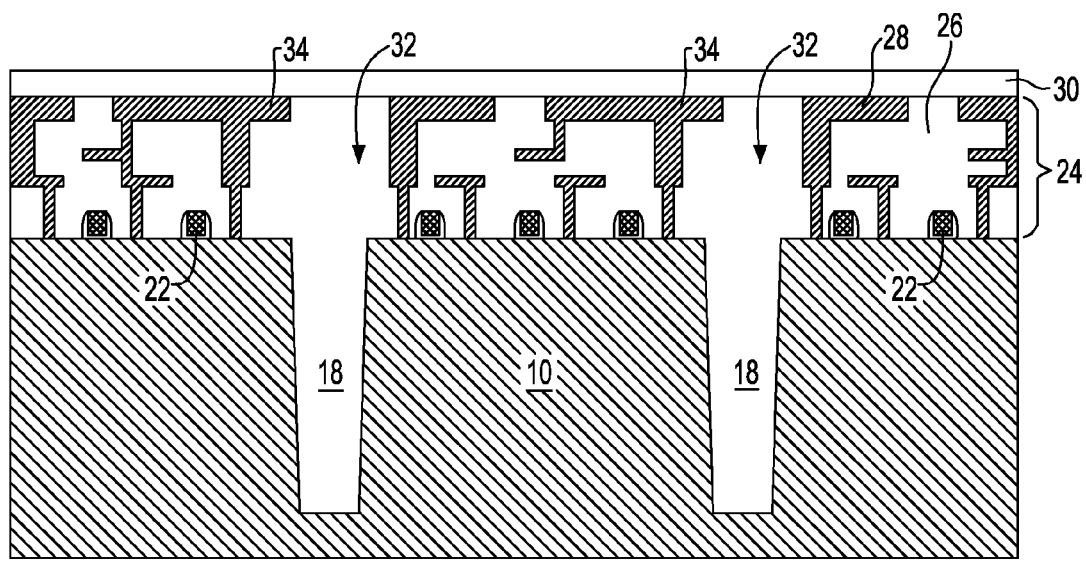

It may be desirable to add a thin (1-2 micron) layer of insulative material 30, such as an oxide, on top of BEOL wiring 24 as shown in FIG. 5. It is preferred that insulative material 30 is present to passivate the BEOL wiring 24 and so it will be shown in the remainder of the Figures.

Figure 6:
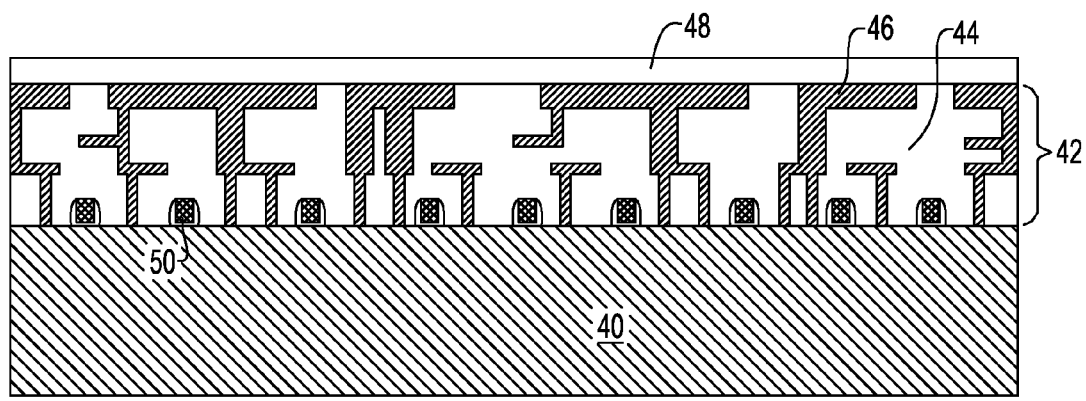

Referring now to FIG. 6, there is shown a second semiconductor wafer 40 which is to be joined to the first semiconductor wafer 10 previously shown in FIGS. 1 to 5. Second semiconductor wafer 40, similarly to the first semiconductor wafer 10, has BEOL wiring 42 which includes an insulative material 44, such as an oxide, and various wiring layers 46. Preferably, the second semiconductor wafer 40 also contains a thin (1-2 micron) layer of insulative material 48, such as an oxide, for the same reason as indicated above. The second semiconductor wafer 40 will also contain devices 50.

Figure 7:
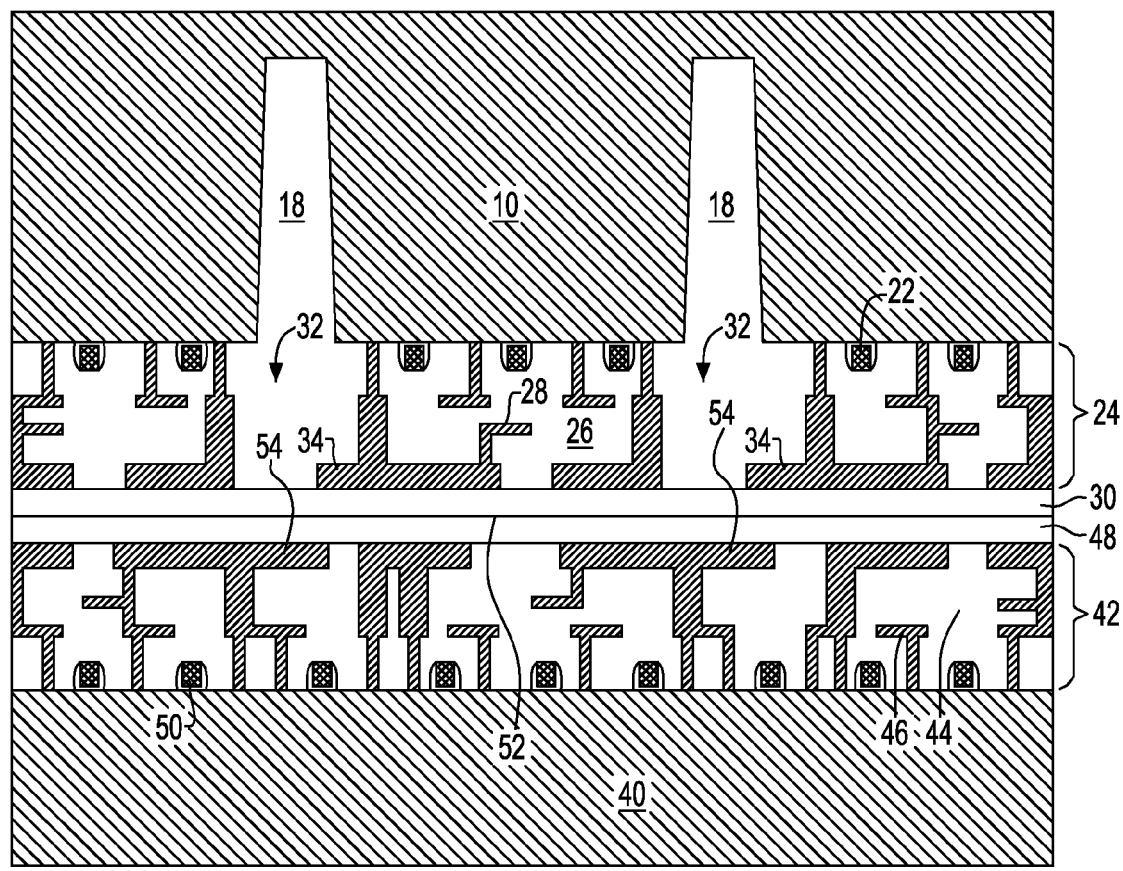

Referring now to FIG. 7, the first semiconductor wafer 10 has been flipped over and bonded to second semiconductor wafer 40 as indicated by bond line 52. In one preferred bonding process, the facing surfaces are cleaned, pressed together and then annealed at 300-500° C. It is important that the regions where the through vias penetrate is insulating. In other areas, metal-to-metal bonding could be used, as well as oxide-to-oxide or adhesive bonding. As can be seen, the semiconductor wafers 10, 40 are arranged so that the side of the semiconductor wafers 10, 40 containing the BEOL wirings 24, 42 are joined. Prior to bonding, the first semiconductor wafer 10 has been aligned with second semiconductor wafer 40 so that the filled trenches 18 align with landing pads 54 of the second semiconductor wafer 40. In one preferred method of alignment, infrared light is used to see through the first semiconductor wafer 10 and find the alignment marks (not shown) for landing pads 54 on the second semiconductor wafer 40.

It was noted previously that the trenches 18 do not extend all the way through the first semiconductor wafer 10. The following is a description of a preferred process for making electrical connections between the first semiconductor wafer 10 and the second semiconductor wafer 40.

Figure 8:
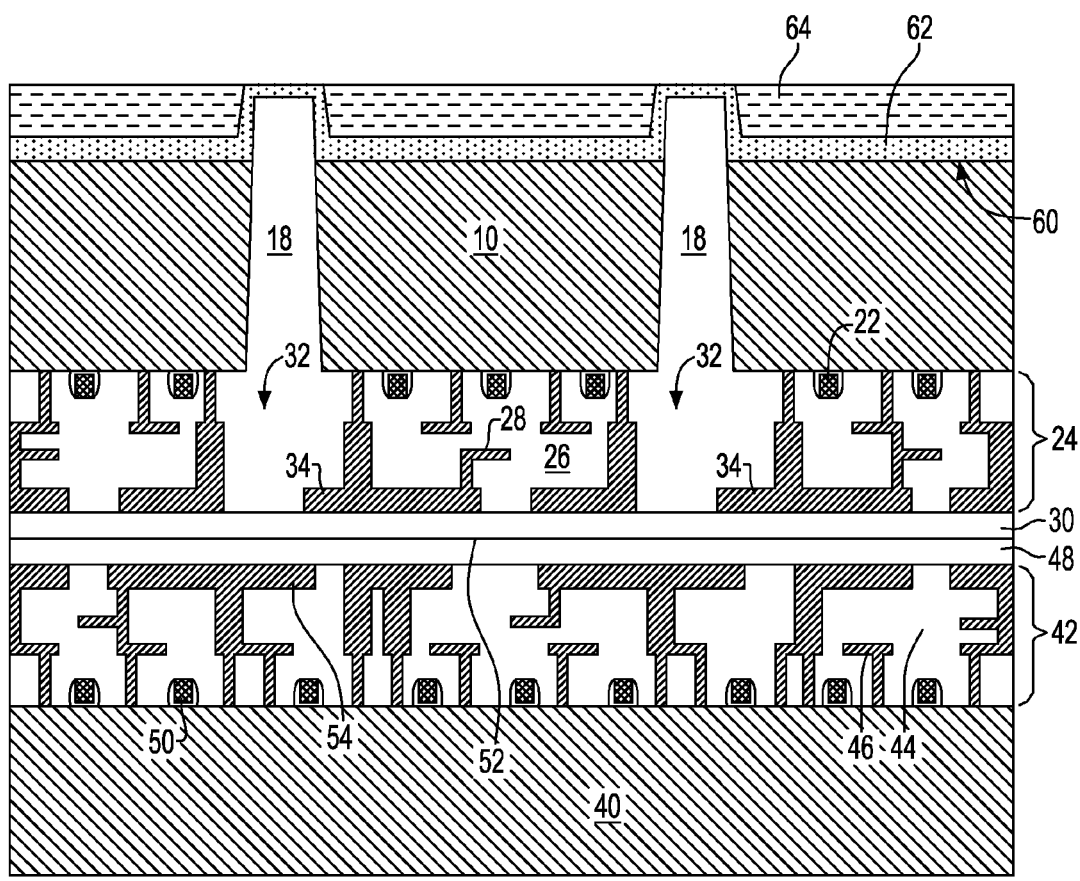

The backside of the first semiconductor wafer 10 is ground down to the top of the filled trenches 18 and then the semiconductor material is recessed by a wet etch selective to oxide as indicated by 60. Thereafter, nitride 62 is blanket deposited followed by a blanket deposition of polysilicon 64. Polysilicon 64 is preferred because it is easy to remove. Materials other than oxides or nitrides could also be used in place of the polysilicon 64. Preferably, the first semiconductor wafer 10 is planarized by a process such as chemical-mechanical polishing stopping on the nitride 62. The structure thus far is illustrated in FIG. 8.

Figure 9:
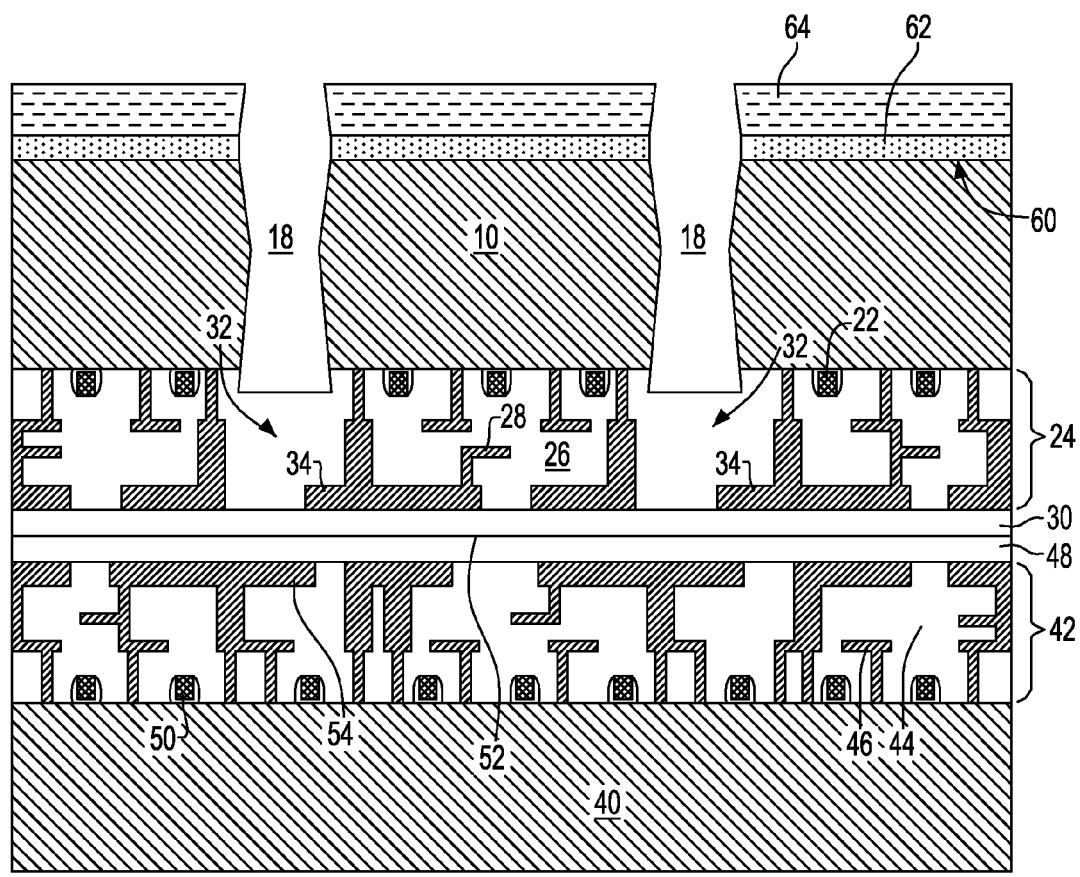

Referring now to FIG. 9, the nitride 62 has been etched and then the trenches 18 have been etched by a process such as RIE. The etching stops at the insulative material 26 or just into the BEOL wiring 24. The trenches 18 have a unique shape due to the way that the trenches 18 are formed. The openings of the trenches 18 at the BEOL side and at the nitride 62 are wider than in the center of the trench 18. This is because when trench 18 was first formed as shown as trench 16 in FIG. 2, the top of the trench 18 (16) is wider due to the RIE process. When the first semiconductor wafer 10 is flipped over and RIEed from the other side, then the opening of the trench 18 by the nitride 62 also becomes wider.

Figure 10:
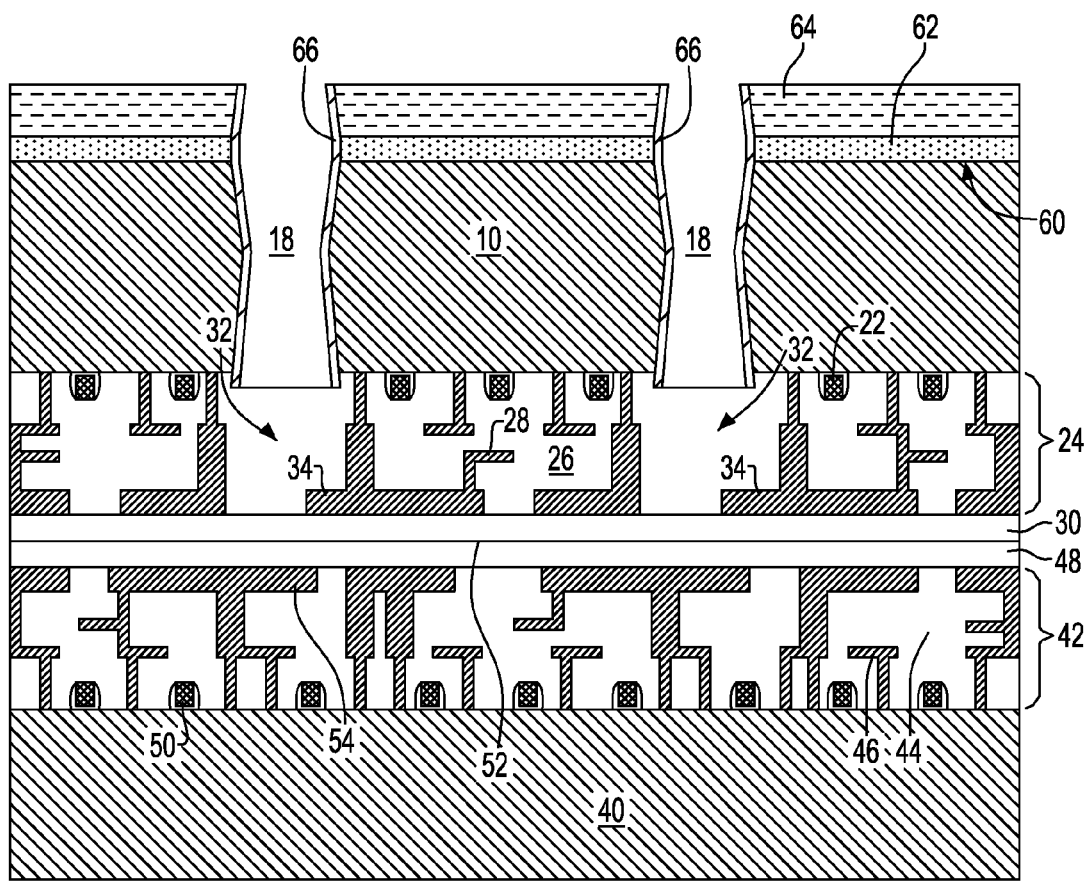

An insulative spacer 66 is then formed on the walls of the trench 18 as shown in FIG. 10. The insulative spacer 66 may be formed by a process such as filling the trench 18 with an insulative material such as an oxide and then etching out the insulative material by a process such as RIE.

Figure 11:
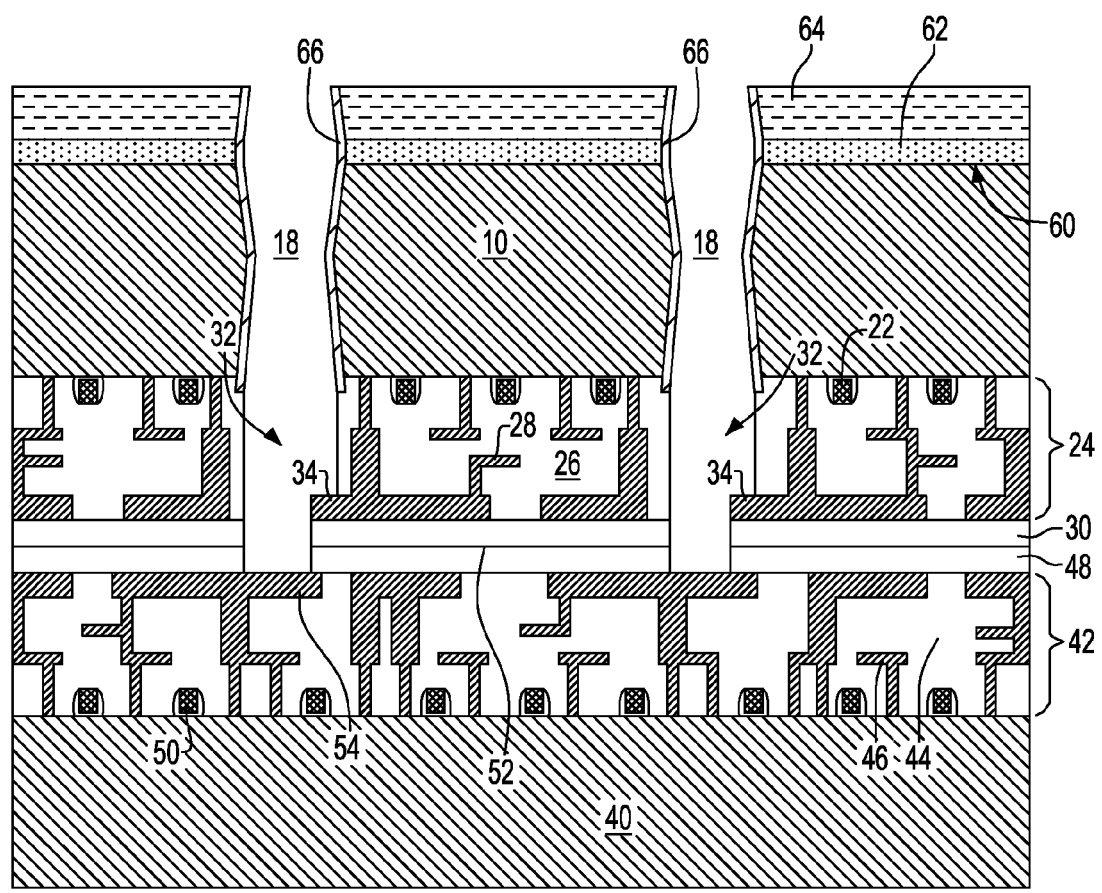

The etching of trench 18 continues as shown in FIG. 11 by a process, such as RIE, which is selective to the metal wirings 28 in BEOL wiring 24 and metal wirings 46 in BEOL wiring 42. The metal wirings 28, 46 are typically copper. The etching continues until pads 34 in BEOL wiring 24 and pads 54 in BEOL wiring 42 are exposed. It can be seen that the gap 32 in BEOL wiring 24 is desirable to allow for the etching of insulative material 26, 44 down to the pads 34, 54.

Figure 12:
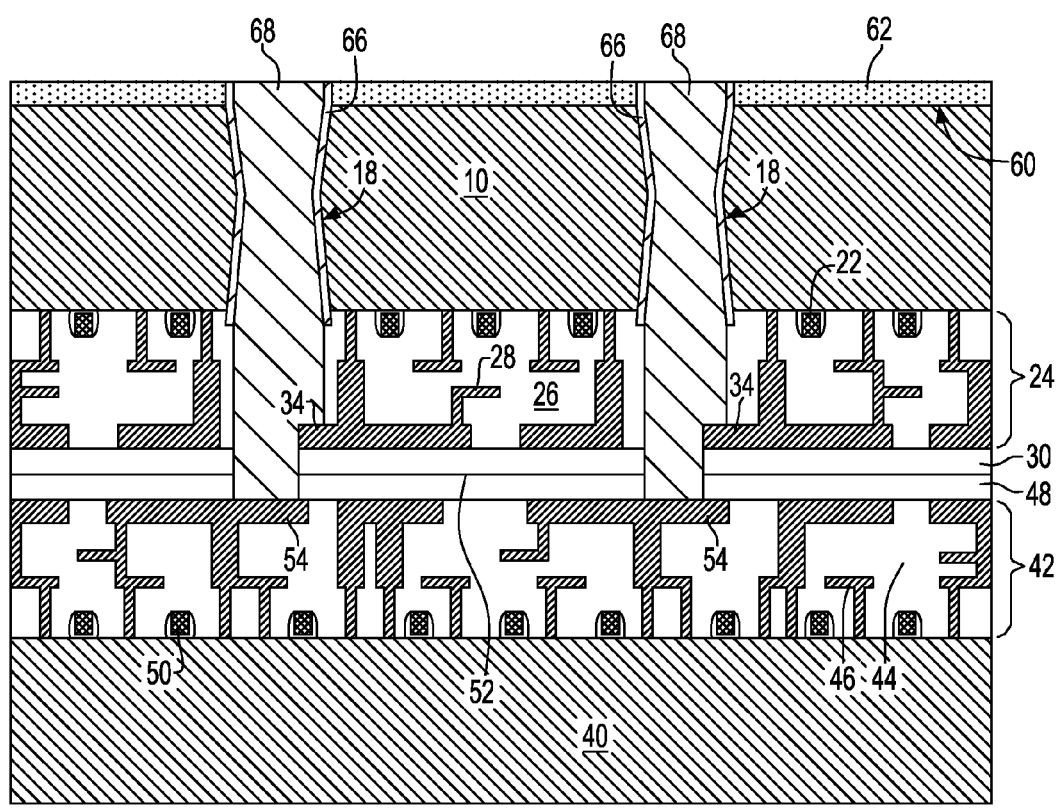

Referring now to FIG. 12, an electrically conductive material 68 has been added to the trench 18 to complete the formation of the through silicon via. The electrically conductive material 68 is preferably copper though other metallurgies such as tungsten are also possible. If copper is the electrically insulative material 68, there should be a barrier layer such as a tantalum nitride layer between the electrically conductive material 68 and insulative spacer 66. This barrier layer is omitted for clarity. The through silicon via thus formed simultaneously connects both pad 34 of BEOL wiring 24 and pad 54 of BEOL wiring 42. FIG. 12 also shows the unique shape of the completed through silicon via.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method of making 3D integrated circuits, comprising the steps of:
    (a) forming at least one trench in a first semiconductor wafer;
    (b) filling the at least one trench with an insulator to form a filled trench;
    (c) forming devices and back end of the line (BEOL) wiring on a first side of the first semiconductor wafer with at least one pad in the BEOL wiring aligned with the at least one filled trench;
    (d) joining the first semiconductor wafer to a second semiconductor wafer having at least one landing pad aligned with the at least one filled trench in the first semiconductor wafer;
    (e) etching the at least one filled trench to remove the insulator;
    (f) forming an insulative spacer on the walls of the at least one trench;
    (g) continuing etching the at least one trench until the at least one pad and the at least one landing pad are exposed; and
    (h) filling the at least one trench with an electrical conductor to simultaneously connect the at least one pad and the at least one landing pad with the electrical conductor.

2. The method of claim 1 further comprising the step after step (b) of etching back the insulator.

3. The method of claim 1 further comprising the step after step (c) of depositing a layer of insulator over the BEOL wiring.

4. The method of claim 1 wherein the second semiconductor wafer has a BEOL wiring and the at least one landing pad is in the BEOL wiring.

5. The method of claim 4 wherein in step (d), the joining is by joining the BEOL wiring of the first semiconductor wafer to the BEOL wiring of the second semiconductor wafer.

6. The method of claim 1 further comprising the steps, between steps (d) and (e) of:
    recessing the first semiconductor wafer on a second side so as to expose the at least one filled trench;
    depositing a layer of nitride over the second side of the first semiconductor wafer and the exposed at least one filled trench; and
    depositing polysilicon over the layer of nitride.

7. The method of claim 1 wherein step (f) comprises depositing an insulator in the trench and then etching out the insulator to leave an insulative spacer on the walls of the at least one trench.

8. The method of claim 1 wherein the trench in step (h) has a center portion, two ends and a width which is narrower in the center portion than in the two ends.

9. A method of making 3D integrated circuits, comprising the steps of:
    (a) forming at least one trench in a first semiconductor wafer, the at least one trench extending from a first side of the first semiconductor wafer;
    (b) filling the at least one trench with an insulator;
    (c) forming devices and back end of the line (BEOL) wiring on the first side of the first semiconductor wafer with at least one pad in the BEOL wiring aligned with the at least one trench, the BEOL wiring having an exposed surface;
    (d) obtaining a second semiconductor wafer having BEOL wiring, the BEOL wiring having at least one landing pad and an exposed surface;
    (e) joining the exposed surface of the BEOL wiring of the first semiconductor wafer to the exposed surface of the BEOL wiring of the second semiconductor wafer such that the at least one landing pad is aligned with the at least one trench;
    (f) etching the first semiconductor wafer from a second side so as to join with the at least one trench and continuing etching of the at least one trench to remove the insulator and stopping in the BEOL wiring;
    (g) forming an oxide spacer on the walls of the at least one trench;
    (h) continuing etching the at least one trench until the at least one pad and the at least one landing pad are exposed; and
    (i) filling the at least one trench with an electrical conductor to simultaneously connect the at least one pad and the at least one landing pad with the electrical conductor.

10. The method of claim 9 further comprising the step after step (b) of etching back the insulator.

11. The method of claim 9 further comprising the step after step (c) of depositing a layer of insulator over the BEOL wiring.

12. The method of claim 9 further comprising the steps, between steps (e) and (f) of:

recessing the first semiconductor wafer on a second side so as to expose the at least one trench;

depositing a layer of nitride over the second side of the first semiconductor wafer and the exposed at least one trench; and depositing polysilicon over the layer of nitride.

13. The method of claim 9 wherein step (g) comprises depositing an insulator in the trench and then etching out the insulator to leave an insulative spacer on the walls of the at least one trench.

14. The method of claim 9 wherein the trench in step (i) has a center portion, two ends and a width which is narrower in the center portion than in the two ends.

\* \* \* \* \*